US007145132B2

(12) United States Patent
Bakker et al.

(10) Patent No.: US 7,145,132 B2
(45) Date of Patent: Dec. 5, 2006

(54) LITHOGRAPHIC APPARATUS, ILLUMINATION SYSTEM AND DEBRIS TRAPPING SYSTEM

(75) Inventors: Levinus Pieter Bakker, Helmond (NL); Derk Jan Wilfred Klunder, Nljverdal (NL); Maarten Marinus Johannes Wilhelmus Van Herpen, Heesch (NL)

(73) Assignee: ASML Netherlands B.V., Veldhoven (NL)

(*) Notice: Subject to any disclaimer, the term of this patent is extended or adjusted under 35 U.S.C. 154(b) by 8 days.

(21) Appl. No.: 11/020,674

(22) Filed: Dec. 27, 2004

(65) Prior Publication Data

US 2006/0138362 A1    Jun. 29, 2006

(51) Int. Cl.
*H01S 1/00*    (2006.01)
*G03B 27/52*    (2006.01)

(52) U.S. Cl. .......................... 250/251; 355/53; 355/30
(58) Field of Classification Search ............ 250/504 R; 355/30, 53
See application file for complete search history.

(56) References Cited

U.S. PATENT DOCUMENTS

| | | | |
|---|---|---|---|
| 6,614,505 | B1 | 9/2003 | Koster et al. |
| 2003/0053594 | A1 | 3/2003 | Fornaciari et al. |
| 2004/0099820 | A1 | 5/2004 | Bristol |
| 2004/0108465 | A1 | 6/2004 | Bakker et al. |
| 2004/0119394 | A1 | 6/2004 | Klebanoff et al. |
| 2005/0016679 | A1 | 1/2005 | Ruzic et al. |
| 2005/0121604 | A1 * | 6/2005 | Mueth et al. ................ 250/251 |
| 2005/0122491 | A1 * | 6/2005 | Bakker et al. ................ 355/30 |
| 2005/0139785 | A1 | 6/2005 | Banine et al. |
| 2005/0140945 | A1 | 6/2005 | Banine et al. |
| 2006/0012761 | A1 * | 1/2006 | Bakker et al. ................ 355/30 |

FOREIGN PATENT DOCUMENTS

| | | |
|---|---|---|
| EP | 1 274 287 A1 | 1/2003 |
| EP | 1 389 747 A2 | 2/2004 |
| EP | 1 389 747 A3 | 4/2004 |
| NL | 1 329 772 A2 | 7/2003 |
| NL | 1 329 772 A3 | 1/2005 |
| WO | WO 99/42904 | 8/1999 |
| WO | WO 03/034153 A2 | 4/2003 |
| WO | WO 03/034153 A3 | 10/2003 |
| WO | WO 03/087867 A2 | 10/2003 |

* cited by examiner

*Primary Examiner*—Nikita Wells
*Assistant Examiner*—Johnnie L Smith, II
(74) *Attorney, Agent, or Firm*—Pillsbury Winthrop Shaw Pittman LLP

(57) ABSTRACT

A debris trapping system for trapping debris particles released with the generation of radiation by a radiation source in a lithographic apparatus includes first and second sets of channels. Each channel of the first set enables radiation from a radiating source to propagate therethrough and has an inner wall for catching debris particles. The second set of channels is situated downstream of the first set with respect to a propagation direction of the radiation. Each channel of the second set enables radiation from the radiating source to also propagate therethrough and has an inner wall for catching debris particles. A gas supply and a gas exhaust are configured to provide between the first set and the second set of channels a gas flow having a net flow direction substantially across the propagation direction of the radiation from a radiating source.

45 Claims, 4 Drawing Sheets

LITHOGRAPHIC APPARATUS, ILLUMINATION SYSTEM AND DEBRIS TRAPPING SYSTEM

FIELD

The present invention relates to a lithographic apparatus, an illumination system, and a debris trapping system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the substrate is limited by the wavelength of the projection radiation. To produce integrated circuits with a higher density of devices, and hence higher operating speeds, it is desirable to image smaller features. While most current lithographic projection apparatus employ ultraviolet light generated by mercury lamps or excimer lasers, it has been proposed to use shorter wavelength radiation, in the range of 5 to 20 nm, in particular around 13 nm.

Such radiation is termed extreme ultra violet (EUV) or soft X-ray and possible sources include, for example, laser produced plasma sources, discharge plasma sources, or synchrotron radiation from electron storage rings. These types of radiation require that the beam path in the apparatus be evacuated to avoid beam scatter and absorption. Because there is no known material suitable for making a refractive optical element for EUV radiation, EUV lithographic apparatus must use mirrors in the radiation (illumination) and projection systems. Even multilayer mirrors for EUV radiation have relatively low reflectivities and are highly susceptible to contamination, which may further reduce their reflectivity and hence the throughput of the apparatus. This may impose further specifications on the vacuum level to be maintained and may necessitate especially that hydrocarbon partial pressures be kept very low.

In a typical discharge plasma source, plasma is formed by an electrical discharge. The plasma may then be caused to compress so that it becomes highly ionized and reaches a very high temperature, causing the emission of EUV radiation. The material used to produce the EUV radiation is typically xenon gas or lithium vapor, although other gases or vapors such as krypton gas or tin or water vapor may also be used. However, these gases or vapors may have a relatively high absorption of radiation within the EUV range and/or be damaging to optics further downstream of the projection beam and their presence should therefore be minimized in the remainder of the lithographic apparatus. A discharge plasma source is disclosed, for example, in U.S. Pat. No. 5,023,897 and U.S. Pat. No. 5,504,795, both of which are incorporated herein by reference.

In a laser produced plasma source a jet of, for example, (clustered) xenon may be ejected from a nozzle. At some distance from the nozzle, the jet is irradiated with a laser pulse of a suitable wavelength for creating a plasma that subsequently will radiate EUV radiation. Other materials, such as water droplets, ice particles, lithium or tin vapor, etc. may also be ejected from a nozzle and be used for EUV generation. In an alternative laser-produced plasma source, a solid (or liquid) material is irradiated to create a plasma for EUV radiation. Laser produced plasma sources are, for example, disclosed in U.S. Pat. No. 5,459,771, U.S. Pat. No. 4,872,189, and U.S. Pat. No. 5,577,092, all of which are incorporated herein by reference.

A common feature of the above sources is that their operation induces a background pressure of some source gas or gases (also including vapors) in or near the source region. Source gases include those gases or vapors of which the plasma is to be created for EUV generation, but also gases or vapors produced during source operation by, for example, laser irradiation of a solid or liquid material. The source gases should be confined to the source region since they may be a cause of substantial absorption of EUV radiation or be a cause of contamination and damage in the remainder of the lithographic apparatus. The particles present in the source gases are hereinafter also referred to as debris particles.

International Patent Application Publication No. WO 99/42904, incorporated herein by reference, describes a filter including a plurality of foils, often referred to as a so-called "foil trap", which in operation is oriented such that radiation propagates along the foils and, as such, through the filter, while debris particles moving off the propagation direction of the radiation are trapped by the foils. A buffer gas is supplied to cool the debris particles and, as such, to further enhance the probability that the debris particles are trapped by the foils.

European Patent Application Publication No. 1 329 772 A2, also incorporated herein by reference, describes the use of a buffer zone, separated from a source zone in which the radiation is generated. A wall is positioned between the source zone and the buffer zone. The wall has a beam aperture for propagation of the radiation from the source zone to the buffer zone. Buffer gas is supplied to the buffer zone and buffer gas is removed from the buffer zone such that the pressure in the buffer zone is less than or approximately equal to the pressure in the source zone, so as to prevent buffer gas to flow to the source zone, and, as such, to prevent the occurrence of an increase of the pressure in the source zone.

International Patent Application Publication No. WO 03/034153, incorporated herein by reference, describes the use of a so-called contaminant trap, including two sets of channels arranged radially about the optical axis and in series with respect to each other. Buffer gas is supplied to a space between the two sets. A part of the gas flows from this space to a radiation entrance of the first set of channels and another part of the gas flows through a radiation exit of the second set of channels.

SUMMARY

It is desirable to provide a debris trapping system that allows for a high pressure of the buffer gas in relation to the source gas to enhance the probability that the debris particles are trapped by the system while simultaneously allowing for high transmission of radiation through the system.

It is further desirable to provide a lithographic apparatus, as well as illumination system including such a debris trapping system.

According to an aspect of the invention, there is provided a lithographic apparatus that includes an illumination system configured to condition a radiation beam. The illumination system includes a source for generating radiation, and a debris trapping system for trapping at least some debris particles released with the generation of radiation. The apparatus also includes a patterning device for patterning the conditioned radiation beam, and a projection system for projecting the patterned radiation beam onto a target portion of a substrate. The debris trapping system includes a first set of channels. Each channel of the first set enables radiation from the source to propagate therethrough and has an inner wall for catching debris particles. The debris trapping system also includes a second set of channels that is situated downstream of the first set of channels with respect to a propagation direction of the radiation. Each channel of the second set enables radiation from the source to also propagate therethrough and has an inner wall for catching debris particles. The debris trapping system further includes a gas supply and a gas exhaust configured to provide between the first set of channels and the second set of channels a gas flow having a net flow-direction substantially across the propagation direction of the radiation.

According to an aspect of the invention, there is provided an illumination system configured to condition a radiation beam in a lithographic apparatus. The illumination system includes a source for generating radiation, and a debris trapping system for trapping at least some debris particles released with the generation of radiation. The debris trapping system includes a first set of channels. Each channel of the first set enables radiation from the source to propagate therethrough and has an inner wall for catching debris particles. The debris trapping system also includes a second set of channels that is situated downstream of the first set of channels with respect to a propagation direction of the radiation. Each channel of the second set enables radiation from the source to also propagate therethrough and has an inner wall for catching debris particles. The debris trapping system further includes a gas supply and a gas exhaust configured to provide between the first set of channels and the second set of channels a gas flow having a net flow-direction substantially across the propagation direction of the radiation.

According to an aspect of the invention, there is provided a debris trapping system for trapping at least some debris particles released with the generation of radiation by a radiation source in a lithographic apparatus. The debris trapping system includes a first set of channels. Each channel of the first set enables radiation from a radiating source to propagate therethrough and has an inner wall for catching debris particles. The debris trapping system also includes a second set of channels that is situated downstream of the first set of channels with respect to a propagation direction of the radiation. Each channel of the second set enables radiation from the radiating source to also propagate therethrough and has an inner wall for catching debris particles. The debris trapping system further includes a gas supply and a gas exhaust configured to provide between the first set of channels and the second set of channels a gas flow having a net flow-direction substantially across the propagation direction of the radiation from a radiating source.

In use, debris particles entering the first set of channels may be trapped by the inner walls of the first set of channels. Debris particles that travel along the propagation direction of the radiation when entering the first set of channels and exit the first set of channels will most likely be deflected by the buffer gas that has a net flow across the propagation direction and is provided in the space between the two sets of channels. As such, these debris particles are most likely to be trapped by the inner walls of the second set of channels, if not removed together with the buffer gas from between the two sets of channels. The first set of channels and the second set of channels provide a high resistance to a gas flow from the space between the two sets of channels. This allows the pressure of the buffer gas in the space between the two sets of channels to be relatively high, further enhancing the effectiveness of the buffer gas in slowing down and/or deflecting the debris particles exiting the first set of channels. As each channel of both the first set of channels and the second set of channels allow for propagation of the radiation, the transmission of the radiation remains high.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
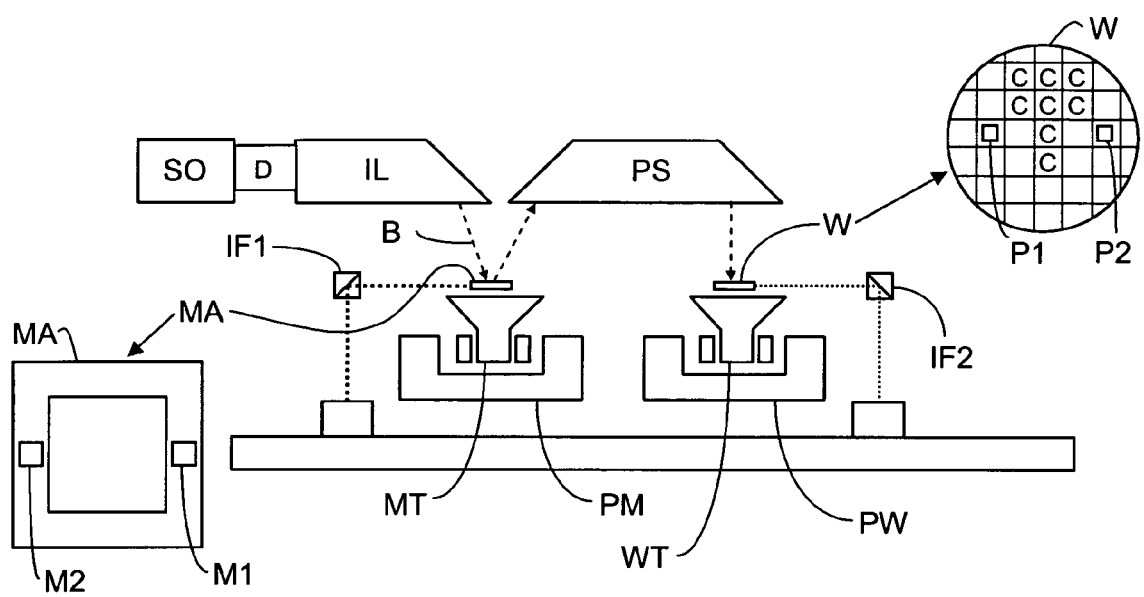
FIG. 1 depicts schematically a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables, while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The illumination system may also be seen as including the source. The source and the lithographic apparatus may, however, be separate entities, for example, when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases, the source may be an integral part of the lithographic apparatus, for example, when the source is a mercury lamp. The source SO and the illuminator IL, together with the beam delivery system, if required, may be referred to as a radiation system. The lithographic apparatus may include a debris trapping system D for trapping at least some debris particles that are released when radiation is generated. The debris trapping system may be a separate entity, may be part of the source, or may be part of the illumination system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally, a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
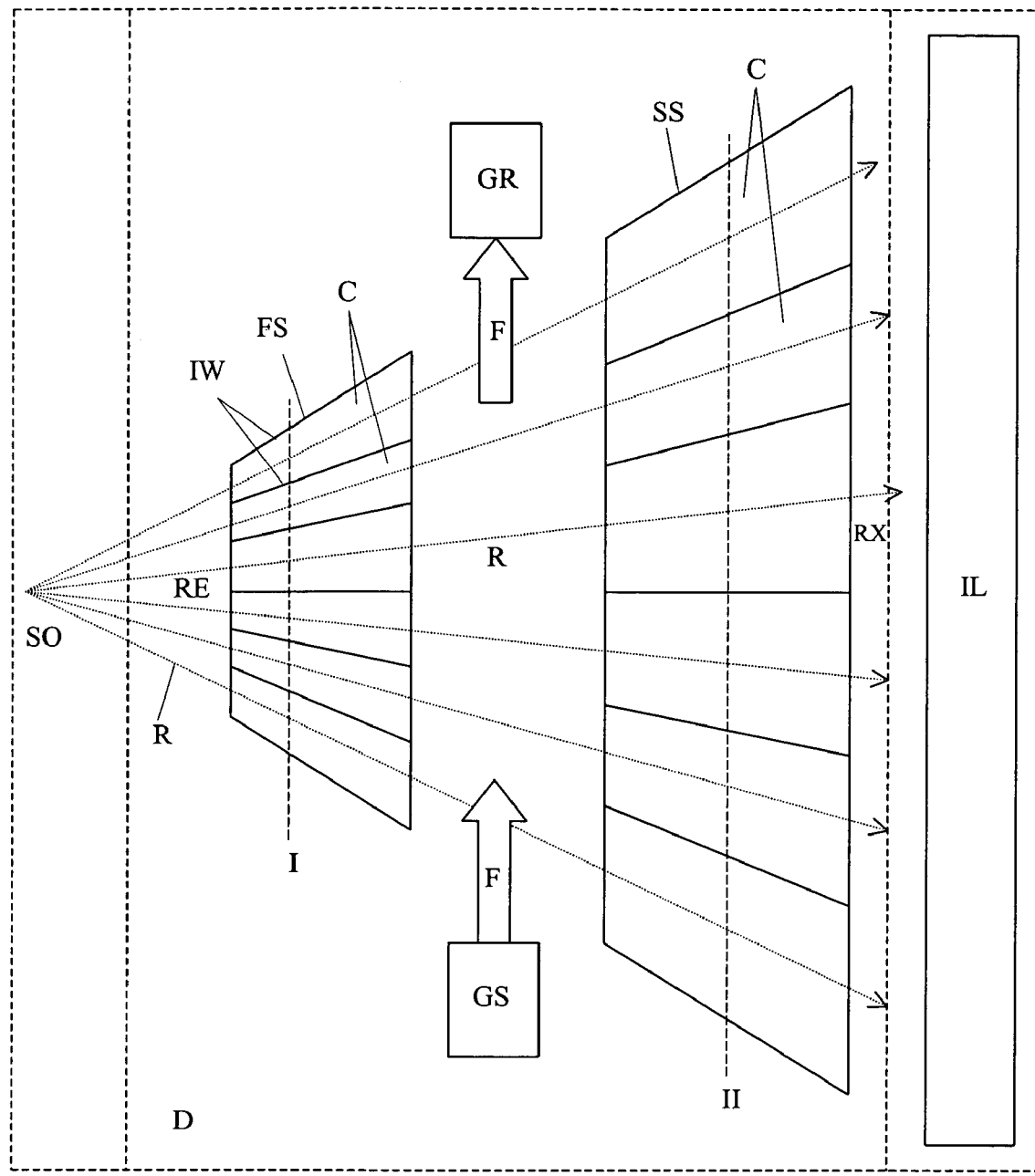
FIG. 2 depicts schematically a debris trapping system as a part of the lithographic apparatus of FIG. 1.

FIG. 2 schematically depicts a debris trapping system D as part of a lithographic apparatus according to an embodiment of the invention. The debris trapping system D may be seen as a separate entity. However, the debris trapping system D may also be seen as part of the source SO. It is possible that the debris trapping system D may be seen as part of the illuminator IL. The system shown in FIG. 2 may also be seen as an illumination system including a source SO for generating radiation and including a debris trapping system D for trapping at least some debris particles that are released when radiation is generated. The debris trapping system D includes a first set FS of channels C. Each channel C of the first set FS has an inner wall IW for catching debris particles (not shown). Each channel C of the first set FS further has a channel direction enabling radiation R from the source SO to propagate through that channel C. The debris trapping system D further includes a second set SS of channels C. The second set SS of channels C is situated downstream of the first set FS of channels C with respect to a propagation direction of the radiation (indicated by arrows at the end of the dotted lines R). Also, each channel C of the second set SS has an inner wall IW for catching debris particles. Each channel C of the second set SS also has a channel direction enabling radiation R from the source SO to also propagate through that channel C. The debris trapping system D further includes a gas supply GS and a gas exhaust GR for arranging between the first set FS of channels C and the second set SS of channels C a gas flow F having a net flow substantially across the propagation direction of the radiation R.

Debris particles (not shown) that have traveled through the channels C of the first set FS in the propagation direction will, by impingement with the gas particles of the gas supplied by the gas supply GS, be deflected. This enhances the probability that the debris particles will be trapped by a inner wall of any of the channels C of the second set SS.

The debris trapping system D is arranged to establish and maintain, at least during operation of the source SO, between the first set FS of channels C and the second set SS of channels C a gas pressure that is much higher than the gas pressure present at a radiation entrance RE of the first set FS of channels C and/or the gas pressure present at a radiation exit RX of the second set FS of channels C. A high pressure of the gas allows for a relatively small interaction length of the gas and the debris particles moving from the first set FS of channels C to the second set SS of channels C. The high gas pressure may easily be obtained by, for example, controlling the gas supply and the gas removal. The resistance of the channels C reduces the likelihood that the buffer gases move through the channels C towards either the source SO or the illuminator IL. Below will be indicated which considerations may be applied when determining the required resistance, or conductivity, of the channels for a gas moving through the channels. In general, it applies that the longer the channels, the higher the resistance the gas experiences in moving through that channel. In that sense, the small interaction length that is possible due to the high gas pressure in the space between the two sets of channels, also allows for relatively long channels and thus for higher resistance of these channels to gas moving through the channels in a situation where the available distance between the source and illuminator is limited. It is to be noted that the source may also benefit from this feature, as proper operation of the source puts a constraint on the maximum acceptable pressure at the source. In a sense, the source is isolated from the "gas chamber" present between the first set of channels and the second set of channels. However, the gas chamber remains optically connected with the source. A high debris suppression, defined as the product of the pressure and the distance over which this pressure holds, may still be achieved. After all, the pressure may be relatively high, compensating for the relatively small distance between the two sets of channels. Due to the high buffer gas pressure possible, and the relatively large channels of the first set of channels and of the second set of channels in practice resulting in a relatively small distance between the two set of channels, a relatively large suppression of debris per unit of length may be achieved.

The debris trapping system D may be arranged to provide a gas flow F so that the net flow direction is substantially normal to at least a part of one of the inner walls IW of the second set SS of channels C. This enhances the likelihood that the inner walls IW of the second set SS of channels C are capable of trapping the debris particles that have been deflected by interaction with the buffer gas. Each inner wall IW of the second set SS of channels C may be substantially planar. This further increases the likelihood that the debris particles deflected by the interaction with the buffer gas will be trapped by inner walls IW of the second set SS of channels C. It is possible that an inner wall IW of the second set SS of channels C is substantially parallel to at least one other inner wall IW of the second set SS of channels C. This may further enhance the likelihood that debris particles deflected by the buffer gas will be trapped by the inner walls IW of the second set SS of channels C.

Figure 5B:
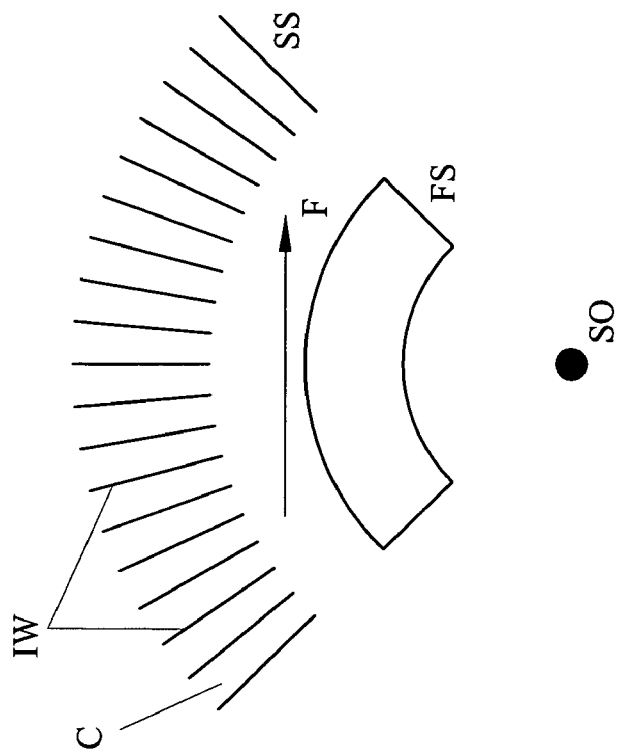
FIG. 5b depicts schematically a second side-view, perpendicular to the first side-view shown in FIG. 5a, of the debris trapping system.
Figure 5A:
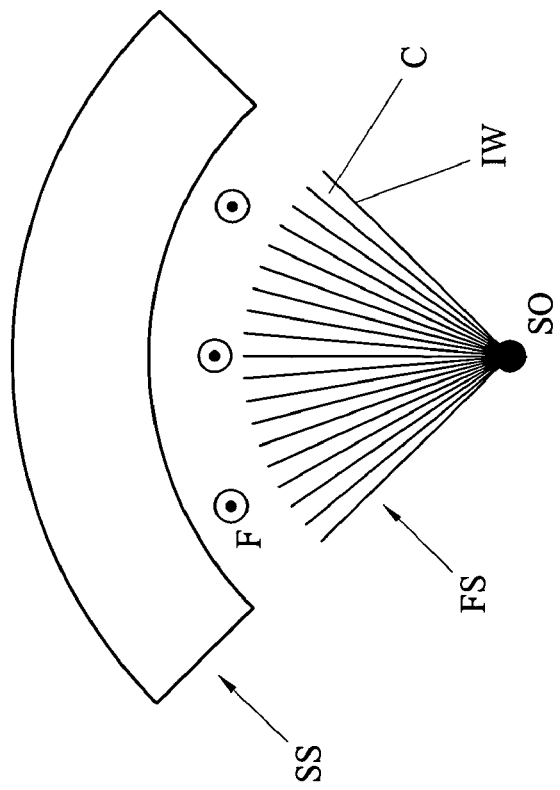
FIG. 5a depicts schematically a first side-view of an embodiment of the debris trapping system of FIG. 2.

In particular, FIG. 5a and FIG. 5b schematically depict a debris trapping system as a part of a lithographic apparatus according to an embodiment of the invention in which at least a part of the, and as shown even the complete, inner walls of the second set of channels is formed by foils or plates. This embodiment will further be discussed below.

Figure 3:
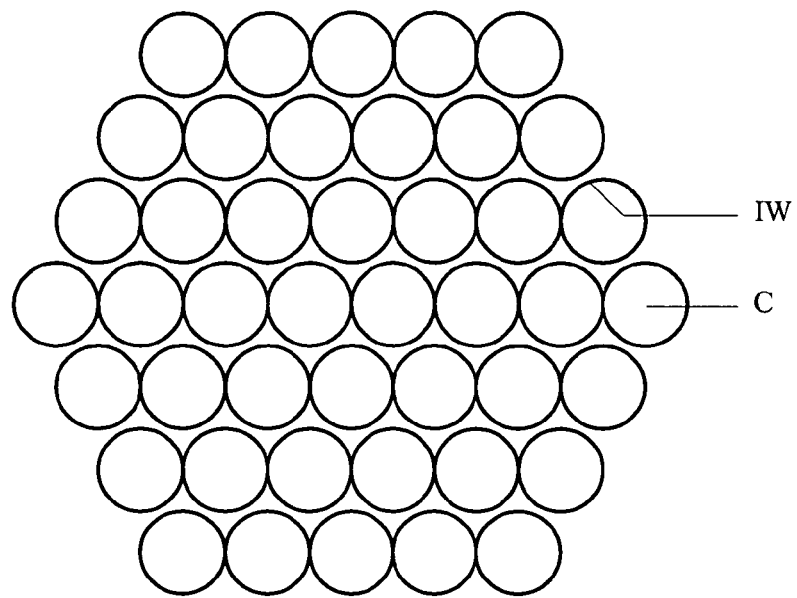
FIG. 3 depicts schematically a cross-section of an embodiment of the debris trapping system of FIG. 2.
Figure 4:
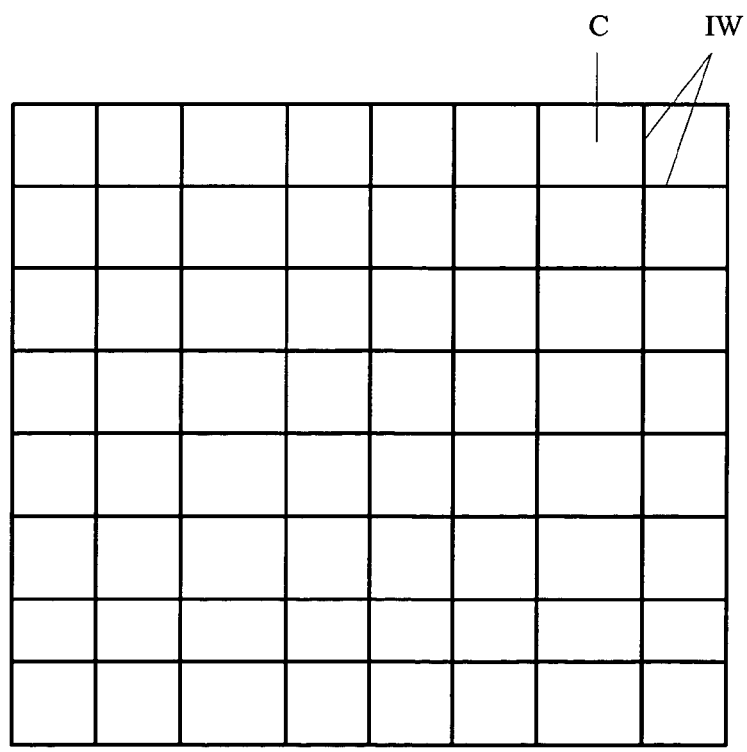
FIG. 4 depicts schematically another cross-section of an embodiment of the debris trapping system of FIG. 2.

It is also possible that each channel of the second set of channels has a cross-section, substantially perpendicular to the direction of propagation of the radiation, of a closed geometrical shape. Both FIG. 3 and FIG. 4 depict schematically a cross-section of a debris trapping system as a part of a lithographic apparatus according to such an embodiment or such embodiments of the invention. The cross-section shown in FIG. 3 may represent a cross-section along line I, a cross-section along line II, or a cross-section along both lines I and II shown in FIG. 2. The cross-sections shown in FIG. 4 may also represent a cross-section along line I, a cross-section along line II, or a cross-section along both lines I and II shown in FIG. 2. A set of channels having a cross-section as shown in either FIG. 3 or FIG. 4 provides a larger resistance against gas moving through these channels than a set of channels formed by parallel plates that each lie in a straight virtual line.

Clearly, the smaller the cross-section of each channel, the higher the resistance a gas experiences when moving through that channel. A person skilled in the art will be able to optimize the number of channels based on a required radiation transmission of such a set of channels, and based on the required resistance such a set of channels should provide to a gas moving through these channels. As indicated before, the length of these channels will also be taken into account. Although FIG. 3 shows circular cross-sections of the channels, and FIG. 4 shows squared cross-sections of the channels, it should be understood that the invention is not limited to these cross-sections. For example, honeycomb cross-sections or other optimized cross-sections may also be useful. It also applies that not all the channels of a set of channels necessarily need to have a similar cross-section.

It is possible that the inner wall IW of one or of each channel C of the second set SS of channels C substantially coincides with a virtual cone, its top coinciding with the source SO. In such an embodiment, the shape of the channels are configured to allow for the radial direction of the radiation leaving the source SO.

So far, the second set of channels has been discussed. Attention is now drawn to the first set FS of channels C. In an embodiment, the debris trapping system is arranged to provide a gas flow such that the net flow direction is substantially parallel to at least a part of one the inner walls of the first set of channels. FIG. 5a schematically depicts a debris trapping system D as a part of a lithographic apparatus according to an embodiment of the invention, in which the gas flow is provided such that the net flow direction is substantially parallel to at least a part of one of the inner walls of the first set of channels. In fact, as shown, each inner wall of the first set of channels is substantially planar. This (virtual) plane intersects with the source SO. The advantages discussed above for the configuration of the second set of channels, equally apply.

Within the context of this specification, the configuration of the inner walls of the first set of channels are regarded as substantially parallel to each other, even though this is not the case in a strict sense of the word parallel. This also applies to the second set of channels, depicted in FIG. 5b. At least a part of an inner wall of the first set of channels is formed by a foil or a plate. By providing the gas flow F such that the net flow direction is substantially parallel to at least a part of one of the inner walls of the first set of channels, at least a part of the gas flow F is kept in a direction along the inner walls of the first set of channels, across the propagation direction of the radiation.

In the embodiment shown in FIG. 5a, FIG. 5a being a first side view of the debris trapping system D, the gas flows in a direction normal to a plane in which the drawing is presented. FIG. 5b schematically depicts another side view that is perpendicular to the side view shown in FIG. 5a. In FIG. 5b, the gas flow is represented by the arrow F. As discussed above, the second set of channels in the gas flow are oriented with respect to each other such that the net flow direction of the gas flow is substantially normal to the inner walls of the second set of channels.

Also, in the embodiment shown in FIGS. 5a and 5b, it applies that the source SO will not be exposed to high gas loads. Even though the first set FS of channels C is relatively transparent for the gas flow F, the resistance the flow F experiences when moving towards the source SO is such that not much gas will reach the source SO. Furthermore, the resistance that the flow of gas experiences when moving towards the gas exhaust GR is much less than the resistance that the flow experiences when moving towards the source, and, consequently, gas will more likely move towards the gas exhaust GR rather than to the source SO. The space SP between the two sets of foils may be minimized, as the pressure may be kept relatively high, and as such, relatively little "debris suppression length" is lost in comparison with a foil trap having one set of channels, and a total length that is similar to the length from the radiation entrance RE to the radiation exit RX of the debris trapping system D shown in FIGS. 2 and 5a and b.

It should be understood that in the embodiment, also, the inner wall IW of each channel C of the first set FS of channels C may have a cross-section, substantially perpendicular to the direction of propagation of the radiation, of a closed geometrical shape. Also, the inner wall IW of each channel C of the first set FS of channels C may substantially coincide with a cone, its top coinciding with the source SO. In this case the flow direction of the buffer gas is not further guided by the inner walls of the first set FS of channels C. However, the resistance of the channels C to a gas moving through the channels C towards the source SO will be substantially higher in comparison to the first set of channels shown in FIG. 5a.

It should be understood that a person skilled in the art should without any difficulty be able to combine, for example, the first set of channels as shown in FIG. 2, in which the channels, for example, have inner walls having a cross-section of a closed geometrical shape, with a second set of channels as shown in FIG. 5b. Also, a combination of the first set of channels as shown in FIG. 5a, and a second set of channels as shown in FIG. 2, having inner walls having a cross-section of a closed geometrical shape, is an embodiment that is a part of the invention described in this specification. It should further be understood that the debris trapping system may be rotated around an axis that coincides with a virtual line that extends through the source. In such an embodiment, the flow direction of the buffer gas rotates preferably with the same rotational speed as the rotational speed of the first and second set of channels.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm), extreme ultra-violet (EUV) radiation (e.g. having a wavelength in the range of 5-20 nm) and (soft) X-ray radiation.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    an illumination system configured to condition a radiation beam, the illumination system comprising
        a source for generating radiation; and
        a debris trapping system for trapping at least some debris particles released with the generation of radiation;
    a patterning device for patterning the conditioned radiation beam; and
    a projection system for projecting the patterned radiation beam onto a target portion of a substrate,
    wherein the debris trapping system comprises
        (i) a first set of channels, each channel of the first set enabling radiation from the source to propagate therethrough and having an inner wall for catching debris particles;
        (ii) a second set of channels, situated downstream of the first set of channels with respect to a propagation direction of the radiation, each channel of the second set enabling radiation from the source to also propagate and having an inner wall for catching debris particles; and
        (iii) a gas supply and a gas exhaust configured to provide between the first set of channels and the second set of channels a gas flow having a net flow direction substantially across the propagation direction of the radiation.

2. A lithographic apparatus according to claim 1, wherein the debris trapping system is arranged to establish and maintain, at least during operation of the source, a gas pressure between the first set of channels and the second set of channels that is much higher than the gas pressure present at a radiation entrance of the first set of channels and/or the gas pressure present at a radiation exit of the second set of channels.

3. A lithographic apparatus according to claim 1, wherein the debris trapping system is arranged to provide a gas flow such that the net flow direction is substantially normal to at least a part of one of the inner walls of the second set of channels.

4. A lithographic apparatus according to claim 3, wherein at least a part of one of the inner walls of the second set of channels is formed by a foil or plate.

5. A lithographic apparatus according to claim 3, wherein one of the inner walls of the second set of channels is substantially parallel to at least one other inner wall of the second set of channels.

6. A lithographic apparatus according to claim 5, wherein each inner wall of the second set of channels is substantially planar.

7. A lithographic apparatus according to claim 3, wherein each channel of the second set of channels has a cross-section, substantially perpendicular to the direction of propagation of the radiation, of a closed geometrical shape.

8. A lithographic apparatus according to claim 3, wherein each channel of the second set of channels substantially coincides with a virtual cone having a top coinciding with the source.

9. A lithographic apparatus according to claim 1, wherein the debris trapping system is arranged to provide the gas flow such that the net flow direction is substantially parallel to at least a part of one of the inner walls of the first set of channels.

10. A lithographic apparatus according to claim 9, wherein at least a part of one of the inner walls of the first set of channels is formed by a foil or plate.

11. A lithographic apparatus according to claim 9, wherein one of the inner walls of the first set of channels is substantially parallel to at least one other inner wall of the first set of channels.

12. A lithographic apparatus according to claim 11, wherein each inner wall of the first set of channels is substantially planar.

13. A lithographic apparatus according to claim 9, wherein each channel of the first set of channels has a cross-section, substantially perpendicular to the direction of propagation of the radiation, of a closed geometrical shape.

14. A lithographic apparatus according to claim 9, wherein each channel of the first set of channels substantially coincides with a cone having a top coinciding with the source.

15. A lithographic apparatus according to claim 1, wherein the debris trapping system is rotatable around an axis which coincides with a virtual line that extends through the source.

16. An illumination system configured to condition a radiation beam in a lithographic apparatus, the illumination system comprising:
a source for generating radiation, and
a debris trapping system for trapping at least some debris particles released with the generation of radiation,
wherein the debris trapping system comprises
(i) a first set of channels, each channel of the first set enabling radiation from the source to propagate therethrough and having an inner wall for catching debris particles;
(ii) a second set of channels, situated downstream of the first set of channels with respect to a propagation direction of the radiation, each channel of the second set enabling radiation from the source to also propagate therethrough and having an inner wall for catching debris particles; and
(iii) a gas supply and a gas exhaust configured to provide between the first set of channels and the second set of channels a gas flow having a net flow direction substantially across the propagation direction of the radiation.

17. An illumination system according to claim 16, wherein the debris trapping system is arranged to establish and maintain, at least during operation of the source, a gas pressure between the first set of channels and the second set of channels that is much higher than the gas pressure present at a radiation entrance of the first set of channels and/or the gas pressure in operation present at a radiation exit of the second set of channels.

18. An illumination system according to claim 16, wherein the debris trapping system is arranged to provide a gas flow such that the net flow direction is substantially normal to at least a part of one of the inner walls of the second set of channels.

19. An illumination system according to claim 18, wherein at least a part of one of the inner walls of the second set of channels is formed by a foil or plate.

20. An illumination system according to claim 18, wherein one of the inner walls of the second set of channels is substantially parallel to at least one other inner wall of the second set of channels.

21. An illumination system according to claim 20, wherein each inner wall of the second set of channels is substantially planar.

22. An illumination system according to claim 19, wherein each channel of the second set of channels has a cross-section, substantially perpendicular to the direction of propagation of the radiation, of a closed geometrical shape.

23. An illumination system according to claim 18, wherein each channel of the second set of channels substantially coincides with a virtual cone having a top coinciding with the source.

24. An illumination system according to claim 16, wherein the debris trapping system is arranged to provide the gas flow such that the net flow direction is substantially parallel to at least a part of one of the inner walls of the first set of channels.

25. An illumination system according to claim 24, wherein at least a part of one of the inner walls of the first set of channels is formed by a foil or plate.

26. An illumination system according to claim 24, wherein one of the inner walls of the first set of channels is substantially parallel to at least one other inner wall of the first set of channels.

27. An illumination system according to claim 26, wherein each inner wall of the first set of channels is substantially planar.

28. An illumination system according to claim 24, wherein each channel of the first set of channels has a cross-section, substantially perpendicular to the direction of propagation of the radiation, of a closed geometrical shape.

29. An illumination system according to claim 24, wherein each channel of the first set of channels substantially coincides with a cone having top coinciding with the source.

30. An illumination system according to claim 16, wherein the debris trapping system is rotatable around an axis that coincides with a virtual line that extends through the source.

31. A debris trapping system for trapping at least some debris particles released with the generation of radiation by a radiation source in a lithographic apparatus, the debris trapping system comprising:
a first set of channels, each channel of the first set enabling radiation from a radiating source to propagate therethrough and having an inner wall for catching debris particles;
a second set of channels, situated downstream of the first set of channels with respect to a propagation direction of the radiation, each channel of the second set enabling radiation from the radiating source to also propagate therethrough and having an inner wall for catching debris particles; and
a gas supply and a gas exhaust configured to provide between the first set of channels and the second set of channels a gas flow having a net flow-direction substantially across the propagation direction of the radiation from a radiating source.

32. A debris trapping system according to claim 31, wherein the debris trapping system is arranged to establish and maintain, at least during operation of a radiation source, a gas pressure between the first set of channels and the second set of channels that is much higher than the gas pressure present at a radiation entrance of the first set of channels and/or the gas pressure present at a radiation exit of the second set of channels.

33. A debris trapping system according to claim 31, wherein the debris trapping system is arranged to provide a gas flow such that the net flow direction is substantially normal to at least a part of one of the inner walls of the second set of channels.

34. A debris trapping system according to claim 33, wherein at least a part of one of the inner walls of the second set of channels is formed by a foil or plate.

35. A debris trapping system according to claim 33, wherein one of the inner walls of the second set of channels is substantially parallel to at least one other inner wall of the second set of channels.

36. A debris trapping system according to claim 35, wherein each inner wall of the second set of channels is substantially planar.

37. A debris trapping system according to claim 33, wherein each channel of the second set of channels has a cross-section, substantially perpendicular to the direction of propagation of the radiation generated by a radiating source, of a closed geometrical shape.

38. A debris trapping system according to claim 33, wherein each channel of the second set of channels substantially coincides with a virtual cone, and wherein, when in use, the top of the cone coincides with a radiating source.

39. A debris trapping system according to claim 31, wherein the debris trapping system is arranged to provide the gas flow such that the net flow direction is substantially parallel to at least a part of one of the inner walls of the first set of channels.

40. A debris trapping system according to claim 39, wherein at least a part of one of the inner walls of the first set of channels is formed by a foil or plate.

41. A debris trapping system according to claim 39, wherein one of the inner walls of the first set of channels is substantially parallel to at least one other inner wall of the first set of channels.

42. A debris trapping system according to claim 41, wherein each inner wall of the first set of channels is substantially planar.

43. A debris trapping system according to claim 39, wherein each channel of the first set of channels has a cross-section, substantially perpendicular to the direction of propagation of the radiation generated by a radiating source, of a closed geometrical shape.

44. A debris trapping system according to claim 39, wherein each channel of the first set of channels substantially coincides a virtual cone, and wherein, when in use, the top of the cone coincides with a radiating source.

45. A debris trapping system according to claim 31, wherein the debris trapping system is rotatable around an axis.

* * * * *